United States Patent [19]
Standley

[11] Patent Number: 5,396,595
[45] Date of Patent: Mar. 7, 1995

[54] METHOD AND SYSTEM FOR COMPRESSION AND DECOMPRESSION OF DATA

[75] Inventor: Benje J. Standley, Hillsboro, Oreg.

[73] Assignee: SpaceLabs Medical, Inc., Redmond, Wash.

[21] Appl. No.: 873,478

[22] Filed: Apr. 24, 1992

[51] Int. Cl.$^6$ .................. G06F 12/00; G06F 13/00
[52] U.S. Cl. .................... 395/250; 341/106; 364/281.3; 364/230.3; 364/DIG. 1
[58] Field of Search .............. 395/250; 341/50, 51, 341/52, 106

[56] References Cited

U.S. PATENT DOCUMENTS 5,010,345  4/1991  Nagy .................. 341/65
5,253,325  10/1993  Clark ................. 395/2

Primary Examiner—Robert L. Richardson
Attorney, Agent, or Firm—Seed and Berry

[57] ABSTRACT

A method and system for compressing and decompressing data is provided. In preferred embodiments, a computer system compresses a data buffer comprising a plurality of symbols wherein each symbol has one or more occurrences. The system generates a symbol table containing each symbol and having a corresponding index. For each occurrence of the symbol in the data buffer, the system determines the index for that symbol into the symbol table, and encodes the index into a variable-length portion, a delimiter, and a fixed-length portion. The system then outputs the encoding as the compressed data buffer.

17 Claims, 9 Drawing Sheets

Figure 5

| 501 | 502 | 503 | 504 | 505 | 506 | 507 | 508 | 509 | 510 | 511 |
|---|---|---|---|---|---|---|---|---|---|---|
| 0 | 129 | 1130 | 1 | 1130 | 2 | 2260 | 3 | 3390 | 4 | 4520 |
| 1 | 130 | 1090 | 2 | 2180 | 2 | 2180 | 3 | 3270 | 4 | 4360 |
| 2 | 128 | 1006 | 3 | 3018 | 3 | 3018 | 3 | 3018 | 4 | 4024 |
| 3 | 131 | 582 | 4 | 2328 | 3 | 1746 | 3 | 1746 | 4 | 2328 |
| 4 | 123 | 478 | 5 | 2390 | 4 | 1912 | 4 | 1912 | 4 | 1912 |
| 5 | 127 | 450 | 6 | 2700 | 4 | 1800 | 4 | 1800 | 4 | 1800 |
| 6 | 122 | 449 | 7 | 3143 | 5 | 2245 | 4 | 1796 | 4 | 1796 |
| 7 | 124 | 449 | 8 | 3592 | 5 | 2245 | 4 | 1796 | 4 | 1796 |
| 8 | 121 | 384 | 9 | 3456 | 6 | 2304 | 5 | 1920 | 5 | 1920 |
| 9 | 125 | 347 | 10 | 3470 | 6 | 2082 | 5 | 1735 | 5 | 1735 |
| 10 | 120 | 309 | 11 | 3399 | 7 | 2163 | 5 | 1545 | 5 | 1545 |
| 11 | 126 | 291 | 12 | 3492 | 7 | 2037 | 5 | 1455 | 5 | 1455 |
| 12 | 132 | 195 | 13 | 2535 | 8 | 1560 | 6 | 1170 | 5 | 975 |
| 13 | 119 | 165 | 14 | 2310 | 8 | 1320 | 6 | 990 | 5 | 825 |
| 14 | 118 | 103 | 15 | 1545 | 9 | 927 | 6 | 618 | 5 | 515 |
| 15 | 117 | 43 | 16 | 688 | 9 | 387 | 6 | 258 | 5 | 215 |
| 16 | 143 | 35 | 17 | 595 | 10 | 350 | 7 | 245 | 6 | 210 |
| 17 | 141 | 34 | 18 | 612 | 10 | 340 | 7 | 238 | 6 | 204 |
| 18 | 136 | 33 | 19 | 627 | 11 | 363 | 7 | 231 | 6 | 198 |
| 19 | 133 | 32 | 20 | 640 | 11 | 352 | 7 | 224 | 6 | 192 |
| 20 | 138 | 30 | 21 | 630 | 12 | 360 | 8 | 240 | 6 | 180 |
| 21 | 116 | 29 | 22 | 638 | 12 | 348 | 8 | 232 | 6 | 174 |
| 22 | 135 | 28 | 23 | 644 | 13 | 364 | 8 | 224 | 6 | 168 |
| 23 | 137 | 26 | 24 | 624 | 13 | 338 | 8 | 208 | 6 | 156 |
| 24 | 134 | 24 | 25 | 600 | 14 | 336 | 9 | 216 | 7 | 168 |
| 25 | 146 | 24 | 26 | 624 | 14 | 336 | 9 | 216 | 7 | 168 |
| 26 | 139 | 23 | 27 | 621 | 15 | 345 | 9 | 207 | 7 | 161 |
| 27 | 145 | 22 | 28 | 616 | 15 | 330 | 9 | 198 | 7 | 154 |
| 28 | 144 | 21 | 29 | 609 | 16 | 336 | 10 | 210 | 7 | 147 |
| 29 | 115 | 20 | 30 | 600 | 16 | 320 | 10 | 200 | 7 | 140 |
| 30 | 140 | 19 | 31 | 589 | 17 | 323 | 10 | 190 | 7 | 133 |
| 31 | 142 | 19 | 32 | 608 | 17 | 323 | 10 | 190 | 7 | 133 |
| 32 | 106 | 17 | 33 | 561 | 18 | 306 | 11 | 187 | 8 | 136 |
| 33 | 147 | 16 | 34 | 544 | 18 | 288 | 11 | 176 | 8 | 128 |
| 34 | 112 | 15 | 35 | 525 | 19 | 285 | 11 | 165 | 8 | 120 |
| 35 | 113 | 14 | 36 | 504 | 19 | 266 | 11 | 154 | 8 | 112 |
| 36 | 111 | 12 | 37 | 444 | 20 | 240 | 12 | 144 | 8 | 96 |
| 37 | 107 | 11 | 38 | 418 | 20 | 220 | 12 | 132 | 8 | 88 |
| 38 | 114 | 11 | 39 | 429 | 21 | 231 | 12 | 132 | 8 | 88 |
| 39 | 148 | 11 | 40 | 440 | 21 | 231 | 12 | 132 | 8 | 88 |
| 40 | 104 | 9 | 41 | 369 | 22 | 198 | 13 | 117 | 9 | 81 |
| 41 | 151 | 9 | 42 | 378 | 22 | 198 | 13 | 117 | 9 | 81 |
| 42 | 108 | 8 | 43 | 344 | 23 | 184 | 13 | 104 | 9 | 72 |
| 43 | 149 | 8 | 44 | 352 | 23 | 184 | 13 | 104 | 9 | 72 |
| 44 | 155 | 8 | 45 | 360 | 24 | 192 | 14 | 112 | 9 | 72 |
| 45 | 80 | 7 | 46 | 322 | 24 | 168 | 14 | 98 | 9 | 63 |
| 46 | 81 | 7 | 47 | 329 | 25 | 175 | 14 | 98 | 9 | 63 |
| 47 | 103 | 7 | 48 | 336 | 25 | 175 | 14 | 98 | 9 | 63 |

| 501 | 502 | 503 | 504 | 505 | 506 | 507 | 508 | 509 | 510 | 511 |
|---|---|---|---|---|---|---|---|---|---|---|
| 48 | 105 | 7 | 49 | 343 | 26 | 182 | 15 | 05 | 10 | 70 |
| 49 | 150 | 7 | 50 | 350 | 26 | 182 | 15 | 05 | 10 | 70 |
| 50 | 110 | 6 | 51 | 306 | 27 | 162 | 15 | 90 | 10 | 60 |
| 51 | 152 | 6 | 52 | 312 | 27 | 162 | 15 | 90 | 10 | 60 |
| 52 | 78 | 5 | 53 | 265 | 28 | 140 | 16 | 80 | 10 | 50 |
| 53 | 83 | 5 | 54 | 270 | 28 | 140 | 16 | 80 | 10 | 50 |
| 54 | 91 | 5 | 55 | 275 | 29 | 145 | 16 | 80 | 10 | 50 |
| 55 | 95 | 5 | 56 | 280 | 29 | 145 | 16 | 80 | 10 | 50 |
| 56 | 102 | 5 | 57 | 285 | 30 | 150 | 17 | 85 | 11 | 55 |
| 57 | 109 | 5 | 58 | 290 | 30 | 150 | 17 | 85 | 11 | 55 |
| 58 | 156 | 5 | 59 | 295 | 31 | 155 | 17 | 85 | 11 | 55 |
| 59 | 76 | 4 | 60 | 240 | 31 | 124 | 17 | 68 | 11 | 44 |
| 60 | 79 | 4 | 61 | 244 | 32 | 128 | 18 | 72 | 11 | 44 |
| 61 | 93 | 4 | 62 | 248 | 32 | 128 | 18 | 72 | 11 | 44 |
| 62 | 98 | 4 | 63 | 252 | 33 | 132 | 18 | 72 | 11 | 44 |
| 63 | 101 | 4 | 64 | 256 | 33 | 132 | 18 | 72 | 11 | 44 |
| 64 | 153 | 4 | 65 | 260 | 34 | 136 | 19 | 76 | 12 | 48 |
| 65 | 73 | 3 | 66 | 198 | 34 | 102 | 19 | 57 | 12 | 36 |
| 66 | 74 | 3 | 67 | 201 | 35 | 105 | 19 | 57 | 12 | 36 |
| 67 | 90 | 3 | 68 | 204 | 35 | 105 | 19 | 57 | 12 | 36 |
| 68 | 154 | 3 | 69 | 207 | 36 | 108 | 20 | 60 | 12 | 36 |
| 69 | 75 | 2 | 70 | 140 | 36 | 72 | 20 | 40 | 12 | 24 |
| 70 | 85 | 2 | 71 | 142 | 37 | 74 | 20 | 40 | 12 | 24 |
| 71 | 87 | 2 | 72 | 144 | 37 | 74 | 20 | 40 | 12 | 24 |
| 72 | 89 | 2 | 73 | 146 | 38 | 76 | 21 | 42 | 13 | 26 |
| 73 | 94 | 2 | 74 | 148 | 38 | 76 | 21 | 42 | 13 | 26 |
| 74 | 97 | 2 | 75 | 150 | 39 | 78 | 21 | 42 | 13 | 26 |
| 75 | 99 | 2 | 76 | 152 | 39 | 78 | 21 | 42 | 13 | 26 |
| 76 | 159 | 2 | 77 | 154 | 40 | 80 | 22 | 44 | 13 | 26 |
| 77 | 167 | 2 | 78 | 156 | 40 | 80 | 22 | 44 | 13 | 26 |
| 78 | 71 | 1 | 79 | 79 | 41 | 41 | 22 | 22 | 13 | 13 |
| 79 | 77 | 1 | 80 | 80 | 41 | 41 | 22 | 22 | 13 | 13 |
| 80 | 84 | 1 | 81 | 81 | 42 | 42 | 23 | 23 | 14 | 14 |
| 81 | 88 | 1 | 82 | 82 | 42 | 42 | 23 | 23 | 14 | 14 |
| 82 | 92 | 1 | 83 | 83 | 43 | 43 | 23 | 23 | 14 | 14 |
| 83 | 96 | 1 | 84 | 84 | 43 | 43 | 23 | 23 | 14 | 14 |
| 84 | 100 | 1 | 85 | 85 | 44 | 44 | 24 | 24 | 14 | 14 |
| 85 | 157 | 1 | 86 | 86 | 44 | 44 | 24 | 24 | 14 | 14 |
| 86 | 158 | 1 | 87 | 87 | 45 | 45 | 24 | 24 | 14 | 14 |
| 87 | 160 | 1 | 88 | 88 | 45 | 45 | 24 | 24 | 14 | 14 |
| 88 | 165 | 1 | 89 | 89 | 46 | 46 | 25 | 25 | 15 | 15 |
| 89 | 166 | 1 | 90 | 90 | 46 | 46 | 25 | 25 | 15 | 15 |
| 90 | 169 | 1 | 91 | 91 | 47 | 47 | 25 | 25 | 15 | 15 |
| 91 | 171 | 1 | 92 | 92 | 47 | 47 | 25 | 25 | 15 | 15 |
| 92 | 174 | 1 | 93 | 93 | 48 | 48 | 26 | 26 | 15 | 15 |
| 93 | 178 | 1 | 94 | 94 | 48 | 48 | 26 | 26 | 15 | 15 |
| 94 | 179 | 1 | 95 | 95 | 49 | 49 | 26 | 26 | 15 | 15 |
| | | | | 66300 | | 43553 | | 36372 | | 37338 |
| | | | | 512 | | 513 | | 514 | | 515 |

500B

METHOD AND SYSTEM FOR COMPRESSION AND DECOMPRESSION OF DATA

TECHNICAL FIELD

This invention relates to data compression and decompression and, more particularly, to a method and system for encoding that is a combination of fixed-length and variable-length encoding.

BACKGROUND OF THE INVENTION

The electronic collection and storage of information presents problems in many environments. For example, when clinical data is collected from a patient through a patient monitor, vast amounts of data can be collected during a short interval. A computer system typically stores this data in computer memory for later processing. The computer memory has a limited capacity and can quickly fill up with the collected data.

To reduce the memory requirements of collected data, some computer systems compress data before storing it in the computer memory. When the collected data is needed for processing, the computer system decompresses the data. Thus, while the data is not needed, the memory requirements are minimized. Similarly, to reduce data transmission time, data is transmitted from one computer to another in compressed format. The receiving computer then decompresses the data before processing.

Many compression and decompression methods are known. Various methods have a variety of advantages. For example, some methods generate a large reduction in data size. Other methods preserve all the original data through the compression and decompression process. These methods are referred to as being lossless because no data is lost. Other methods compress data very quickly or decompress data very quickly. These various methods also have a variety of disadvantages. For example, some methods do not generate a large reduction in data size. Other methods do not preserve all the original data through the compression and decompression process; that is, the decompressed data is only an approximation of the original data. Also, some methods compress or decompress slowly. Some methods use considerable computer memory when compressing or decompressing. Some methods are usable for specific types of data, e.g., ASCII text or electrocardiogram wave forms.

Some compression and decompression methods use a fixed-length encoding, while others use a variable-length encoding. A fixed-length encoding method represents each symbol by the same number of bits. For example, the American Standard Code Information for Interchange (ASCII) is a fixed-length encoding. The ASCII standard specifies that each character is represented by 8 bits. A variable-length encoding method represents the symbols by a varying number of bits. For example, the well-known Morse code is a variable-length encoding.

Fixed-length and variable-length encoding methods each have advantages and disadvantages. A major advantage of a variable-length encoding is that it produces a smaller encoded data buffer than a fixed-length encoding. Variable-length encoding methods typically assign shorter codes to more frequently used symbols. A major advantage of fixed-length encoding is that the encoding and decoding are particularly efficient when performed by a computer system. For example, when the code length is a multiple of a byte length, then bit manipulations (e.g., shifting) that are necessary for variable-length codes are not needed.

It would be desirable to have an encoding scheme that is not dependent on the type of data, that produces small compressed data buffers, and that allows for efficient decoding.

SUMMARY OF THE INVENTION

It is an object of the present invention to provide a data compression and decompression method that combines both a variable-length and fixed-length encoding.

It is another object of the present invention to provide an encoding method based on modulo arithmetic in which a number is encoded as a variable-length quotient portion and a fixed-length remainder portion.

These and other objects, which will become apparent as the invention is fully described below, are obtained by an improved method and system for compressing and decompressing data. In preferred embodiments, a computer system compresses a data buffer that comprises a plurality of symbols wherein each symbol has one or more occurrences. The system generates a symbol table containing each symbol and the count of the occurrences in the data buffer and having an index for each symbol. For each occurrence of a symbol in the data buffer, the system determines the index for that symbol into the symbol table and encodes the index into a format with a variable-length portion, a delimiter, and a fixed-length portion. The system then outputs the encodings as the compressed data buffer.

BRIEF DESCRIPTION OF THE DRAWINGS

FIG. 5 shows the compressed buffer sizes for the sample data buffer of Table A for suffix lengths 0, 1, 2, and 3

DETAILED DESCRIPTION OF THE INVENTION

Figure 1:
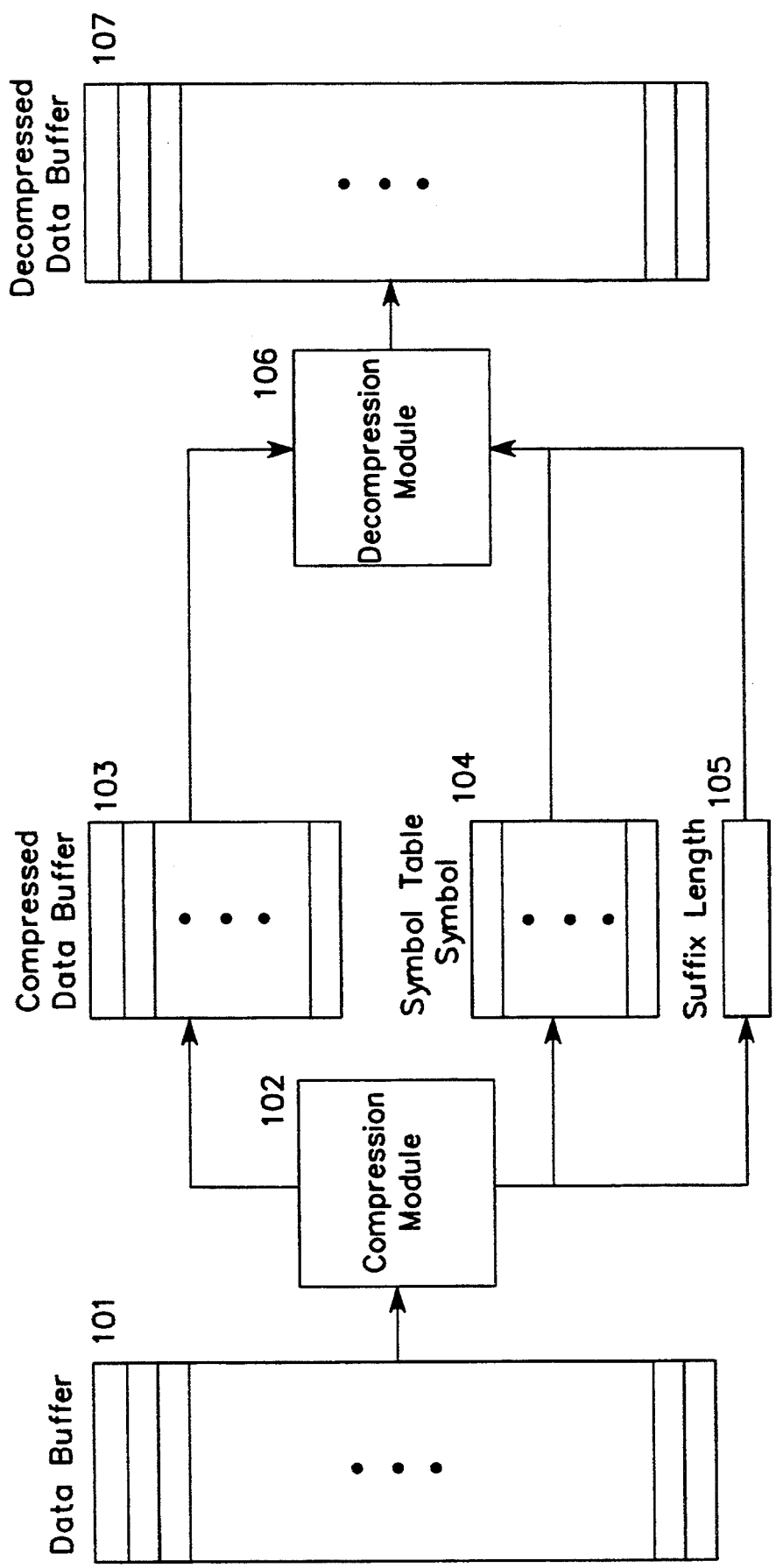
FIG. 1 is an overview of the compression and decompression system in a preferred embodiment of the present invention.

FIG. 1 is an overview of the compression and decompression system in a preferred embodiment of the present invention. Data buffer 101 contains data to be compressed. The data is stored in the data buffer 101 in the form of symbols. Each symbol comprises contiguous bits, preferably, forming one or more bytes. To compress the data, a compression module 102 inputs from the data buffer 101 and outputs to a compressed data buffer 103, symbol table 104, and suffix length 105. Compression module 102 may be implemented on a properly programmed computer. To decompress the compressed data, the decompression module 106 inputs the compressed data buffer 103, the symbol table 104, and the suffix length 105 and outputs the decompressed data buffer 107. The decompression module may be implemented on a properly programmed computer.

Figure 3:
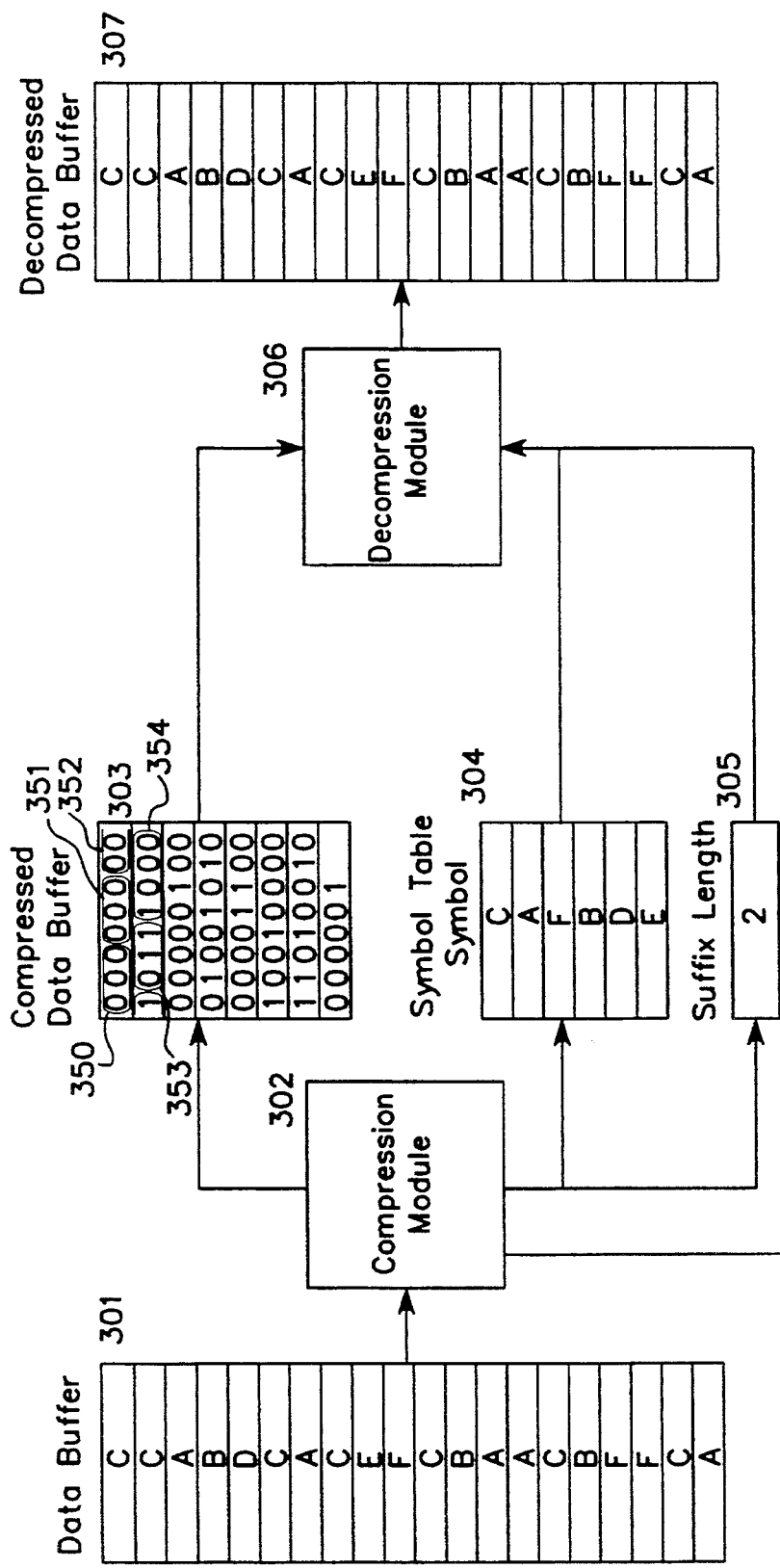
FIG. 3 shows sample data of the compression and decompression system in a preferred embodiment.

To compress the data in the data buffer 101, the compression module 102 first generates a count table (not shown) containing an entry for each unique symbol in the data buffer 101. The entries contain the symbol and the count of the number of occurrences of the symbol in data buffer 101. The count table is preferably sorted in descending order based on the count of the number of occurrences of each symbol in the data buffer 101. The symbol table 104, which is sent to the decompression module 106, is a table of symbols sorted in descending order based on the count of occurrences. The symbol table 104 is generated after the count table. FIG. 3 shows sample data of the compression and decompression system in a preferred embodiment. The sample data buffer 301 contains 20 symbols that are to be encoded. The count table 309 contains one entry for each unique symbol (A through F) in data buffer 301 sorted based on the count. Because symbol C occurs more times in data buffer 301 than the other symbol (its count is 7), it is the first entry in count table 309.

After the count table is completed, the compressed data buffer 103 is generated. The compression module 102 retrieves each symbol serially from data buffer 101, generates the symbol encoding, and then adds the encoding to the compressed data buffer 103. Referring now to FIG. 3, as shown in the encoding table 308, symbol C is encoded as "000" and symbol E is encoded as "1001." In a preferred embodiment, an encoding table is not actually generated. Rather, a symbol encoding is generated each time a symbol is received from the data buffer. The encoding process is described below in detail. Again referring to FIG. 3, the data compression module 302 first retrieves the symbol C from the data buffer 301, generates the encoding, and adds the encoding ("000") to the compressed data buffer 303 at 350. The data compression module 302 then processes the next symbol in the data buffer 301, which is also the symbol C, generates the encoding, and adds the encoding to the compressed data buffer 303 at 351. The data compression module 302 then retrieves the symbol A from the data buffer 301, generates the encoding, and adds the encoding ("001") to the compressed data buffer 303 at 352. The compression module 302 continues with processing all the symbols in the data buffer 301 to generate the compressed data buffer 303.

The compression module 102 encodes the symbols using a variable-length encoding. As shown in FIG. 3, the encoding for symbol C is 3 bits, while the encoding for symbol D is 4 bits. The encodings represent the indices into the symbol table. For example, the encoding "000" represents the index 0 (position of symbol C) into the symbol table, while encoding "1000" represents index 4 (position of symbol D). The encodings have a variable-length prefix, a delimiter, and a fixed-length suffix. The variable-length prefix may have a length of zero. However, if the length of the prefix is greater than zero, it will consist of a string of 1s. The delimiter is a "0," which separates the prefix from the suffix, and the suffix is an integer value, which may have a length of zero. If the suffix has a length of zero, then its integer value is considered to be zero. For example, symbol D is encoded as a "1000." The first bit ("1") is the prefix; the next bit ("0") is the delimiter; and the last two bits ("00") are the suffix. The length of the suffix is 2 bits as shown in FIG. 3 at 305. The selection of a suffix length for a data buffer is described below in detail. Symbol A is encoded as a "001." This encoding has a zero-length prefix since there are no leading 1s. The delimiter is the first bit ("0") and the suffix is the last two bits ("01").

The encoding method of the compression module can be best understood by illustrating the conversion of an encoding to an index during decompression. An index is derived from an encoding by multiplying the number of 1s in the prefix by 4 (when the suffix length is 2) and adding the integer value of the suffix. For example, "010" represents the index 2, because there are no leading 1s (0*4), the delimiter is "0," and the integer value of the suffix ("10") is 2. The encoding "1001" represents the index 5 (1*4+1), because there is a leading "1" (1*4), the delimiter is "0," and the integer value of the suffix ("01") is 1. An index is encoded by the reverse process. The encoding is formed by creating a string where the prefix contains a number of ones equal to the quotient of the index divided by 4 (when the suffix length is 2), the delimiter is "0," and the prefix is the remainder of index divided by 4 (when the suffix length is 2) represented in a binary integer format. For example, the index 2 is encoded as "010,38 because the prefix length is "0 (2/4), the delimiter is "0," and the suffix is "10" (remainder of 2/4). The index of 5 is encoded as "1001," because 5 divided by 4 is 1 (prefix of "1"), the delimiter is "0," and the remainder of 5 divided by 4 is 1 (the suffix of "01").

To decompress the compressed data buffer 103, the decompression module 106 parses the compressed data buffer 103 into encodings for symbols, converts each encoding into an index into the symbol table, retrieves the indexed symbol from the symbol table, and adds the retrieved symbol to the decompressed data buffer 107. For example, as shown in FIG. 3, decompression module 306 first retrieves the string "000" from the compressed data buffer 303, converts the string to index 0, retrieves the symbol ("C") at index 0 from the symbol table, and adds the symbol C to the decompressed data buffer 307. The decompression module 306 continues parsing the encodings and adding the indexed symbols to the decompressed data buffer 307. The decompression module 106 parses the compressed data buffer 103 by counting leading 1s, skipping the delimiter, and saving the fixed-length suffix. The index is calculated by multiplying the count of leading 1s by 2 to the power of the suffix length ($2^{suffixlength}$) and adding in the saved suffix value. The indexed symbol is then retrieved from the symbol table 104 and stored in the decompressed data buffer 107.

In the example of FIG. 3, the suffix length is 2. In a preferred embodiment, the suffix length can vary from data buffer to data buffer. The suffix length for a data buffer is selected to minimize the size of the resulting compressed data buffer as explained in detail below. The indices are encoded in modulo arithmetic format based on the suffix length. In modulo arithmetic format, a number is represented by the integer portion of a quotient, a remainder, and a base. For example, the number 51 is represented in modulo base 4 format as (12, 3), that is, an integer portion of 12 and remainder of 3 (12*4+3=51) and represented in modulo base 5 as (10, 1), that is, an integer portion of 10 and a remainder of 1 (10*5+1=51). In modulo arithmetic format, the base is the divisor and the number to be represented is the dividend. In the present invention, the index is the number to be represented (the dividend) and 2 to the power of the suffix length ($2^{suffixlength}$) is the base (divisor). The prefix represents the quotient, and the suffix represents the remainder. The number 1s in the prefix is equal to the quotient. For example, if quotient is 3, then the prefix is "111." The remainder is stored in binary arithmetic format. For example, if the remainder is 5 and the suffix length is 4, then the suffix is "0101." The divisor is defined by the selection of the suffix length. The divisor is 2 to the power of the suffix length. For example, if the suffix length is 4 then the divisor is 16($2^4$).

Figure 2:
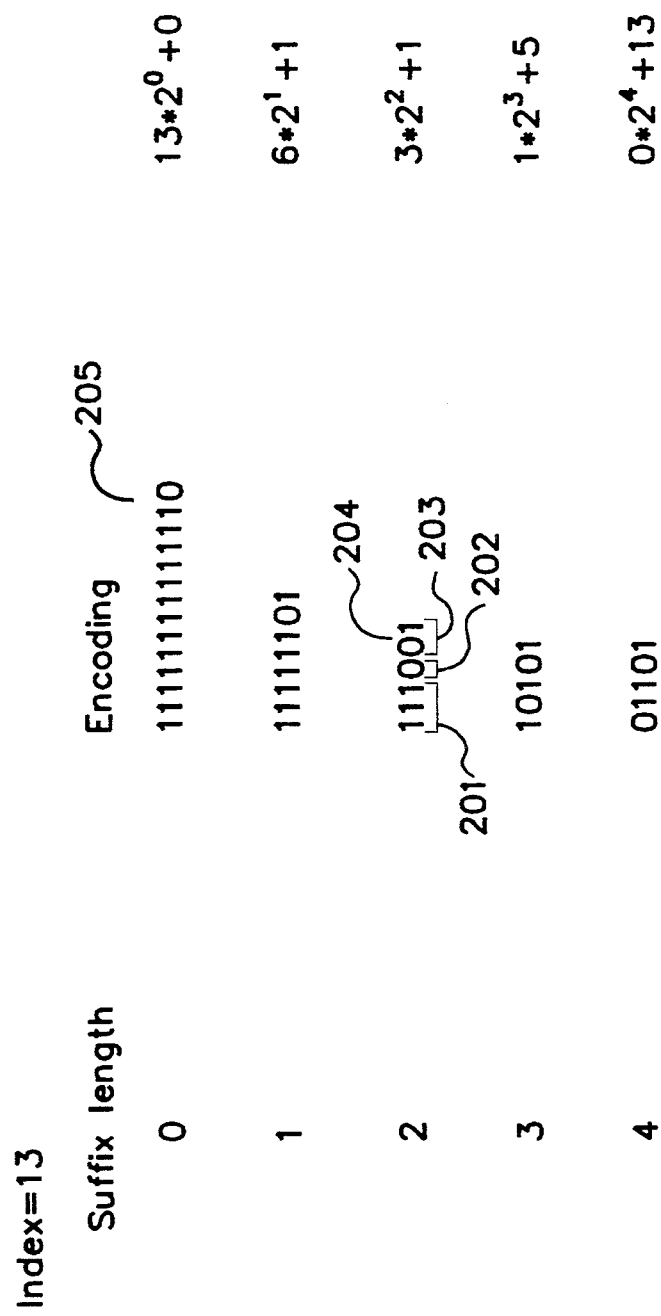
FIG. 2 shows sample encodings for index 13 in a preferred embodiment of the present invention.

FIG. 2 shows sample encodings for index 13 in a preferred embodiment of the present invention. The encodings vary based on the suffix length. In this example, if the suffix length is 0, then the length of the encoding is 14 bits as shown by 205. If the suffix length is 1, then the length of the encoding is 6, as shown by 204. The encoding for index 13 with a suffix length of 2 is "111001." The quotient of 3 is represented by the string "111" in the prefix 201. The first "0" is the delimiter 202. The remainder, which is 1, is represented by the binary value "01" in the suffix 203.

Table A shows the symbols, counts, and encodings for a sample data buffer. The column entitled "symbol" contains the symbol. The column entitled "count" contains the count of the occurrences of the corresponding symbol in a sample buffer. The column entitled "index" represents indices into the symbol table. The columns entitled "suffix length=2" and "suffix length=3" contain the encodings for each of the indices into the symbol table. In this example, the symbol 119 is the fourteenth entry (index=13) into the symbol table and occurs 165 times in the data buffer. The encoding for index 13 is "111001" when the suffix length is 2 and "10101" when the suffix length is 3.

TABLE A

| Index | Symbol | Count | Encoded Symbol for Suffix length = 2 | Encoded Symbol for Suffix length = 3 |
|---|---|---|---|---|
| 0 | 129 | 1130 | 000 | 0000 |
| 1 | 130 | 1090 | 001 | 0001 |
| 2 | 128 | 1006 | 010 | 0010 |
| 3 | 131 | 582 | 011 | 0011 |
| 4 | 123 | 478 | 1000 | 0100 |
| 5 | 127 | 450 | 1001 | 0101 |
| 6 | 122 | 449 | 1010 | 0110 |
| 7 | 124 | 449 | 1011 | 0111 |
| 8 | 121 | 384 | 11000 | 10000 |
| 9 | 125 | 347 | 11001 | 10001 |
| 10 | 120 | 309 | 11010 | 10010 |
| 11 | 126 | 291 | 11011 | 10011 |
| 12 | 132 | 195 | 111000 | 10100 |
| 13 | 119 | 165 | 111001 | 10101 |
| 14 | 118 | 103 | 111010 | 10110 |
| 15 | 117 | 43 | 111011 | 10111 |
| 16 | 143 | 35 | 1111000 | 110000 |
| 17 | 141 | 34 | 1111001 | 110001 |
| 18 | 136 | 33 | 1111010 | 110010 |
| 19 | 133 | 32 | 1111011 | 110011 |
| 20 | 138 | 30 | 11111000 | 110100 |
| 21 | 116 | 29 | 11111001 | 110101 |
| 22 | 135 | 28 | 11111010 | 110110 |
| 23 | 137 | 26 | 11111011 | 110111 |
| 24 | 134 | 24 | 111111000 | 1110000 |
| 25 | 146 | 24 | 111111011 | 1110001 |
| 26 | 139 | 23 | 111111010 | 1110010 |
| 27 | 145 | 22 | 111111011 | 1110011 |
| 28 | 144 | 21 | 1111111000 | 1110100 |
| 29 | 115 | 20 | 1111111001 | 1110101 |
| 30 | 140 | 19 | 1111111010 | 1110110 |
| 31 | 142 | 19 | 1111111011 | 1110111 |
| 32 | 106 | 17 | 11111111000 | 11110000 |
| 33 | 147 | 16 | 11111111001 | 11110001 |
| 34 | 112 | 15 | 11111111010 | 11110010 |
| 35 | 113 | 14 | 11111111011 | 11110011 |
| 36 | 111 | 12 | 111111111000 | 11110100 |
| 37 | 107 | 11 | 111111111001 | 11110101 |
| 38 | 114 | 11 | 111111111010 | 11110110 |
| 39 | 148 | 11 | 111111111011 | 11110111 |
| 40 | 104 | 9 | 1111111111000 | 111110000 |
| 41 | 151 | 9 | 1111111111001 | 111110001 |
| 42 | 108 | 8 | 1111111111010 | 111110010 |
| 43 | 149 | 8 | 1111111111011 | 111110011 |
| 44 | 155 | 8 | 11111111111000 | 111110100 |
| 45 | 80 | 7 | 11111111111001 | 111110101 |
| 46 | 81 | 7 | 11111111111010 | 111110110 |
| 47 | 103 | 7 | 11111111111011 | 111110111 |
| 48 | 105 | 7 | 111111111111000 | 1111110000 |
| 49 | 150 | 7 | 111111111111001 | 1111110001 |
| 50 | 110 | 6 | 111111111111010 | 1111110010 |
| 51 | 152 | 6 | 111111111111011 | 1111110011 |
| 52 | 78 | 5 | 1111111111111000 | 1111110100 |
| 53 | 83 | 5 | 1111111111111001 | 1111110101 |
| 54 | 91 | 5 | 1111111111111010 | 1111110110 |
| 55 | 95 | 5 | 1111111111111011 | 1111110111 |
| 56 | 102 | 5 | 11111111111111000 | 11111110000 |
| 57 | 109 | 5 | 11111111111111001 | 11111110001 |
| 58 | 156 | 5 | 11111111111111010 | 11111110010 |

TABLE A-continued

| Index | Symbol | Count | Encoded Symbol for Suffix length = 2 | Encoded Symbol for Suffix length = 3 |
|---|---|---|---|---|
| 59 | 76 | 4 | 111111111111011 | 11111110011 |
| 60 | 79 | 4 | 111111111111000 | 11111110100 |
| 61 | 93 | 4 | 111111111111001 | 11111110101 |
| 62 | 98 | 4 | 111111111111010 | 11111110110 |
| 63 | 101 | 4 | 111111111111011 | 11111110111 |
| 64 | 153 | 4 | 1111111111111000 | 111111110000 |
| 65 | 73 | 3 | 1111111111111001 | 111111110001 |
| 66 | 74 | 3 | 1111111111111010 | 111111110010 |
| 67 | 90 | 3 | 1111111111111011 | 111111110011 |
| 68 | 154 | 3 | 11111111111111000 | 111111110100 |
| 69 | 75 | 2 | 11111111111111001 | 111111110101 |
| 70 | 85 | 2 | 11111111111111010 | 111111110110 |
| 71 | 87 | 2 | 11111111111111011 | 111111110111 |
| 72 | 89 | 2 | 111111111111111000 | 1111111110000 |
| 73 | 94 | 2 | 111111111111111001 | 1111111110001 |
| 74 | 97 | 2 | 111111111111111010 | 1111111110010 |
| 75 | 99 | 2 | 111111111111111011 | 1111111110011 |
| 76 | 159 | 2 | 1111111111111111000 | 1111111110100 |
| 77 | 167 | 2 | 1111111111111111001 | 1111111110101 |
| 78 | 71 | 1 | 1111111111111111010 | 1111111110110 |
| 79 | 77 | 1 | 1111111111111111011 | 1111111110111 |
| 80 | 84 | 1 | 11111111111111111000 | 11111111110000 |
| 81 | 88 | 1 | 11111111111111111001 | 11111111110001 |
| 82 | 92 | 1 | 11111111111111111010 | 11111111110010 |
| 83 | 96 | 1 | 11111111111111111011 | 11111111110011 |
| 84 | 100 | 1 | 111111111111111111000 | 11111111110100 |
| 85 | 157 | 1 | 111111111111111111001 | 11111111110101 |
| 86 | 158 | 1 | 111111111111111111010 | 11111111110110 |
| 87 | 160 | 1 | 111111111111111111011 | 11111111110111 |
| 88 | 165 | 1 | 1111111111111111111000 | 111111111110000 |
| 89 | 166 | 1 | 1111111111111111111001 | 111111111110001 |
| 90 | 169 | 1 | 1111111111111111111010 | 111111111110010 |
| 91 | 171 | 1 | 1111111111111111111011 | 111111111110011 |
| 92 | 174 | 1 | 11111111111111111111000 | 111111111110100 |
| 93 | 178 | 1 | 11111111111111111111001 | 111111111110101 |
| 94 | 179 | 1 | 11111111111111111111010 | 111111111110110 |

Figure 8:
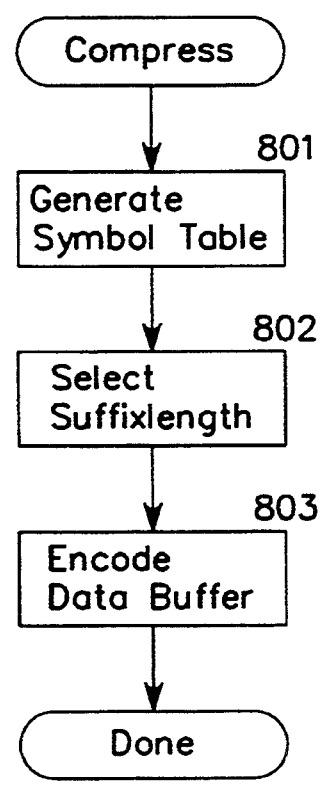
FIG. 8 is an overview flow diagram of the compression system.

FIG. 8 is an overview flow diagram of the compression method. The input to this system is a data buffer of symbols, and the output is a compressed data buffer, a symbol table, and a suffix length. In step 801, the system generates the symbol table for the data buffer. The symbol table contains each unique symbol in the data buffer sorted by the number of occurrences of the symbol in the data buffer. In a preferred embodiment, the system also generates a count table containing the number of occurrences of each symbol in the data buffer. In step 802, the system selects a suffix length for the compressed data. This selection method is described below in detail. The suffix length is selected to minimize the size of the resulting compressed data buffer. In step 803, the system generates an encoding for each symbol and generates the compressed data buffer. This method is described below in detail.

Figure 4:
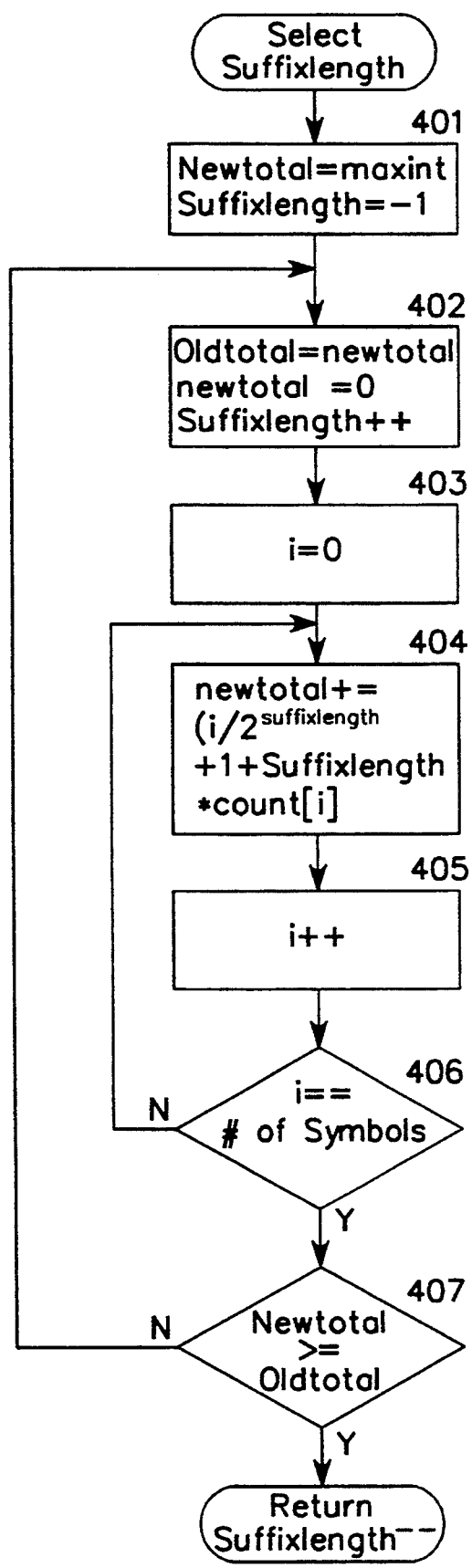
FIG. 4 is a flow diagram of a routine to select the suffix length for a data buffer in a preferred embodiment.

FIG. 4 is a flow diagram of a routine to select the suffix length for a data buffer in a preferred embodiment. This routine determines which suffix length will produce the smallest compressed file. The routine determines the size of the compressed data buffer for successive suffix lengths. When a suffix length would produce a compressed data buffer size that is larger than that for the previous suffix length determined, then that previous suffix length produces the smallest compressed buffer. FIG. 5 shows the compressed buffer sizes for the sample data buffer of Table A for suffix lengths 0, 1, 2, and 3. The compressed buffer size for suffix length 0 is 66300, 1 is 43553, 2 is 36372, and 3 is 37338. Because the buffer size for suffix length 3 is larger than the buffer size for suffix length 2, suffix length 2 is preferably selected for the encoding. FIG. 5 is one table with portion 500B being a continuation of portion 500A. Columns 501 and 502 comprise the symbol table. Column 501 contains the indices into the symbol table, and column 502 contains the symbols. Column 503 contains the counts of occurrences of the symbols. Columns 504 through 511 show the number of bits needed to store all occurrences of the corresponding symbol in the compressed data buffer. Column 504 shows the number of bits needed to encode the corresponding symbol when the suffix length is 0; column 505 shows the number of bits needed to encode all occurrences of the corresponding symbol when the suffix length is 0. Columns 506 and 507, columns 508 and 509, and columns 510 and 511 show the corresponding information for suffix lengths 1, 2, and 3, respectively. For example, it takes 1130 bits to encode all occurrences of symbol 129 (index 0) when the suffix length is 0, and it takes 2260 bits to encode when the suffix length is 1. At the bottom of columns 505, 507, 509, and 511, the values 512, 513, 514, and 515 indicate the total size of the compressed buffer when the suffix length is 0, 1, 2, and 3 respectively. In steps 401 through 407, the routine loops determining the size of the compressed buffer for each suffix length until the minimum size is found. In step 401, the routine initializes variables for the looping. The routine sets variable newtotal to the maximum integer value and variable suffixlength to −1. Variable newtotal accumulates the total number of bits in the compressed buffer for a given suffix length. Variable suffixlength indicates the suffix length currently being processed. In step 402, the routine sets variable oldtotal equal to variable newtotal. Variable oldtotal contains the compressed buffer size for the last suffix length processed. The routine sets variable newtotal to 0 and increments variable suffixlength to indicate the next suffix length. In steps 403 through 406, the routine loops accumulating the total number of bits in the compressed buffer for the suffix length indicated in variable suffixlength. In step 403, the routine initializes index i to 0. Index i is an index into the symbol table. In step 404, the routine increases variable newtotal by the number of bits needed to encode all occurrence of the symbol indexed by index i. The length of the prefix is index i divided by 2 to the power of variable suffixlength ($i/2^{suffixlength}$). The length of the delimiter is 1. The length of the suffix is the value in variable suffixlength. Thus, the encoding length for all occurrences of the symbol indexed by index i is given by the length of each occurrence times the number of occurrences as stored in the count table (($i/2^{suffixlength}+1+$suffixlength)* count[i]). In step 405, the routine increments index i to index the next symbol in the symbol table. In step 406, if index i equals the number of symbols in the symbol table, then all the symbols have been processed and the routine continues at step 407, else the routine loops to step 404 to process the next symbol. In step 407, if variable newtotal is greater than or equal to variable oldtotal, then the previous suffix length processed allowed for the minimum buffer size and the routine decrements variable suffixlength to point to the previous suffix length and returns, else the routine loops to step 402 to process the next suffix length.

Figure 6:
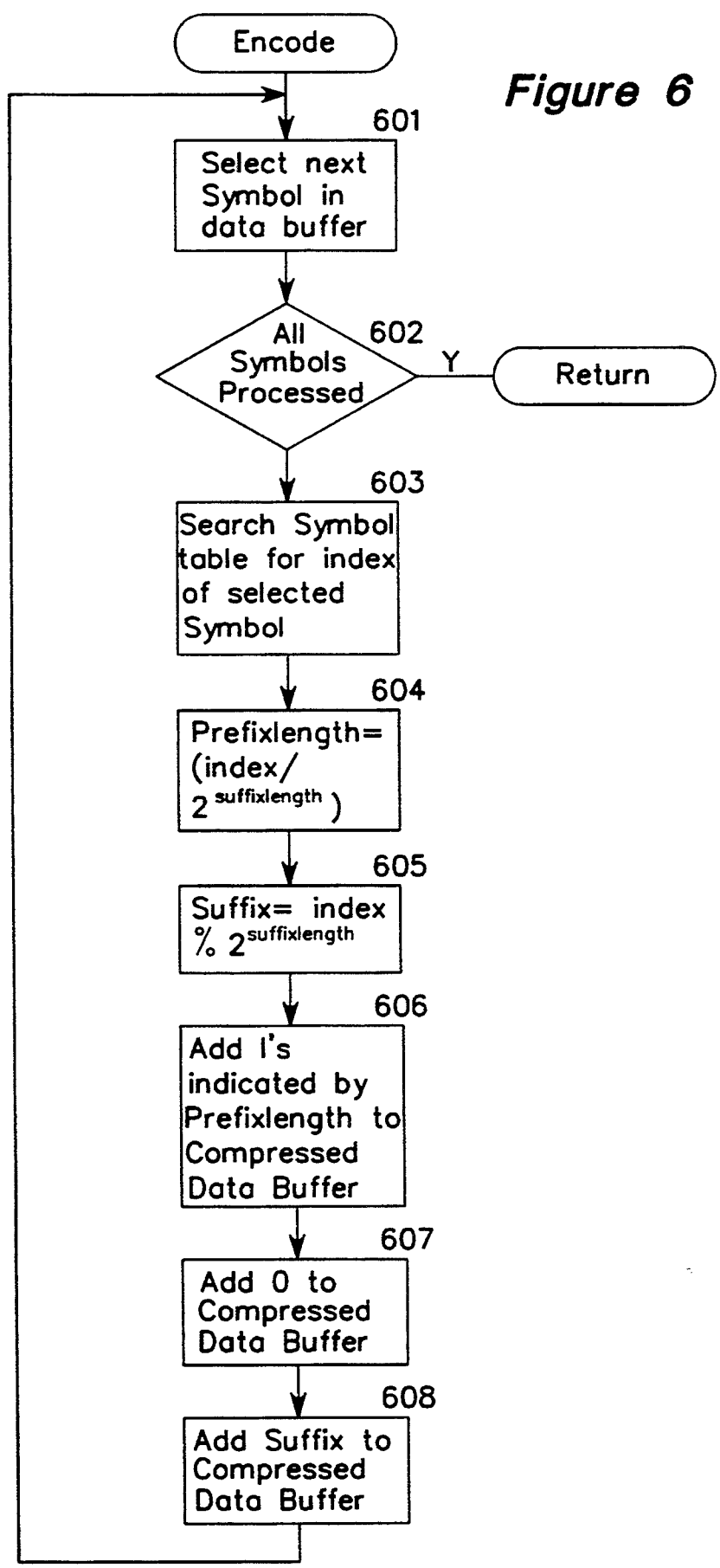
FIG. 6 is a flow diagram of a routine that encodes a data buffer in a preferred embodiment.
Figure 7:
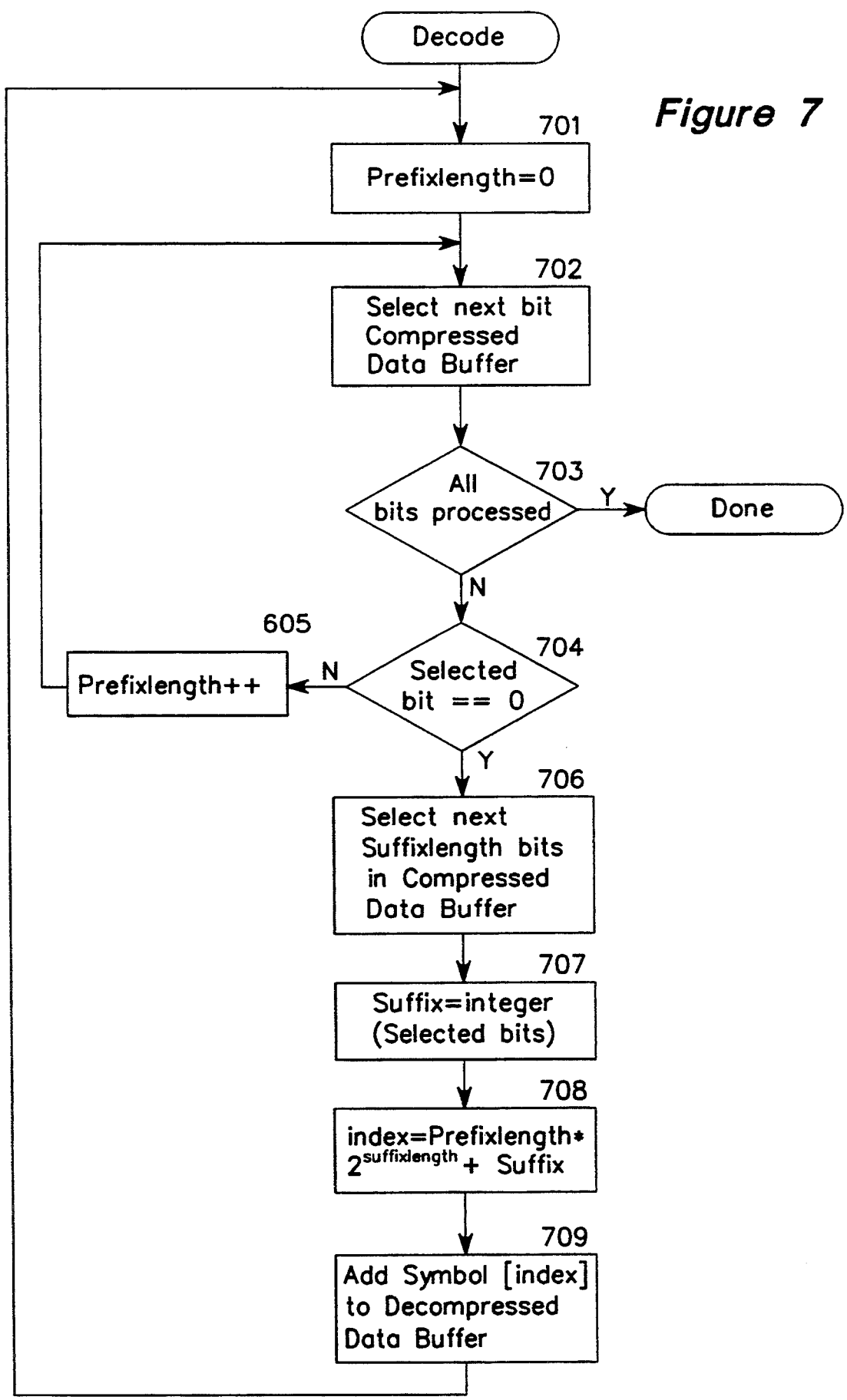
FIG. 7 is a flow diagram of a routine that decodes a compressed data buffer in a preferred embodiment.

FIG. 6 is a flow diagram of a routine than encodes a data buffer in a preferred embodiment. The input to this routine is the data buffer, the symbol table, and the suffix length. In steps 601 through 608, the routine loops processing each symbol in the data buffer. In step 601, the routine selects the next symbol in the data buffer, starting with the first. In step 602, if all the symbols have been processed, then the encoding is done and the routine returns, else the routine continues at step 603. In step 603, the routine determines the symbol table index for the selected symbol. In a preferred embodiment, the routine searches the symbol table for the selected symbol. Alternatively, the cross reference table of indices that is indexed by the symbol could be generated. In step 604, the routine determines the length of the prefix. The prefix length is the index into the symbol table divided by 2 to the power of the suffix length (index-/$2^{suffixlength}$). In step 605, the routine determines the value of the suffix. The suffix value is the remainder of the symbol table index divided by 2 to the power of the suffix length (index % $2^{suffixlength}$). In step 606, the routine adds the prefix to the compressed data buffer. The prefix is a string of 1s of the length defined by the prefix length. In step 607, the routine adds a 0 as a delimiter to the compressed data buffer. In step 608, the routine adds the suffix to the compressed data buffer and loops to step 601 to process the next occurrence of a symbol FIG. 7 is a flow diagram of a routine that decodes a compressed data buffer in a preferred embodiment. The input to this routine is the compressed data buffer, the symbol table, and suffix length. The output is the decompressed data buffer. In steps 701 through 705, the routine loops searching for the next delimiter bit in the compressed data buffer and determining the length of the prefix. In step 701, the routine initializes the variable prefixlength to 0. In step 702, the routine selects the next bit from the compressed data buffer, starting with the first bit. In step 703, if all the bits have been processed, then the decoding is complete, else the routine continues at step 704. In step 704, if the selected bit equals 0, then it is a delimiter and the routine continues at step 706 to determine the suffix, else the routine increments the variable prefixlength in step 705 and loops to step 702. In step 706, the routine selects the next number of bits indicated by the suffix length. In step 707, the routine sets variable suffix equal to the integer value of the selected bits. In step 708, the routine converts the encoding to the symbol table index. The variable index is set to the variable prefixlength times 2 to the power of the suffix length plus the variable suffix. In step 709, the routine adds the symbol table value indicated by variable index to the decompressed data buffer and loops to step 702 to decode the next index.

Although the present invention has been described in terms of a preferred embodiment, modifications within the spirit of the invention will be apparent to those skilled in the art. For example, one skilled in the art would appreciate that the encoding could be rearranged to have the fixed-length portion first, followed by the variable-length portion, and then the delimiter, or that the delimiter could be a 1 and the variable-length portion could be a string of 0s. The scope of the present invention is defined by the claims which follow.

I claim:

1. A method in a computer system of compressing a data buffer, the data buffer comprising a plurality of symbols, each symbol having one or more occurrences, the method comprising the computer-implemented steps of:

generating a symbol table, the symbol table containing each symbol and having a corresponding index; and for each occurrence of a symbol in the data buffer,
        determining the index for that symbol in the symbol table;
        encoding the determined index into a variable-length portion, a delimiter, and a fixed-length portion; and outputting the encoding.

2. The method of claim 1 wherein the symbols in the symbol table are ordered based on the number of occurrences of the corresponding symbol in the data buffer.

3. The method of claim 1 including the step of determining the length of the fixed-length portion.

4. The method of claim 3 wherein the step of determining the length of the fixed-length portion is based on a resulting compressed data buffer size.

5. The method of claim 1 wherein the step of outputting the encoding stores the encoding in a compressed data buffer.

6. The method of claim 1 wherein the step of encoding the determined index generates a variable-length portion that is a string with a length equal to the integer portion of the determined index divided by 2 to the power of the length of the fixed-length portion and the fixed-length portion is the binary integer representation of the remainder of the determined index divided by 2 to the power of the length of the fixed-length portion.

7. The method of claim 1 wherein the variable-length portion comprises a string of bits each with the same bit value and the delimiter is a bit with the opposite bit value.

8. A method in a computer system of decoding an encoded symbol, the encoded symbol represented as an encoded index into a symbol table, the symbol table having a plurality of symbols, each symbol having a corresponding index into the symbol table, the method comprising computer-implemented the steps of:

decoding the encoded index to generate a decoded index; and using the decoded index to retrieve the corresponding symbol from the symbol table wherein the retrieved symbol is the decoded representation of the encoded symbol.

9. The method of claim 8 wherein the encoded index has a variable-length portion, a delimiter, and a fixed-length portion.

10. The method of claim 9 wherein the step of decoding the encoded index includes determining the length of the variable-length portion and the length of the fixed-length portion and decoding the index by the formula $$Lv*2^{Lf}+f$$

wherein Lv is the length of the variable-length portion, Lf is the length of the fixed-length portion, and f is the value of an integer represented by the fixed-length portion.

11. A method in a computer system of encoding a number, the method comprising the computer-implemented steps of:

determining a divisor;

determining the integer quotient of the number divided by the divisor;

determining the remainder of the number divided by the divisor;

generating a string of quotient bits of length equal to the integer quotient, wherein each bit has the same bit value;

generating a string of remainder bits representing the remainder; and generating a delimiter bit having a different bit value than the bit value of the bits in the generated string of quotient bits to indicate the end of the generated string of quotient bits, wherein the quotient bits, the delimiter bit, and the remainder bits comprise the encoded number.

12. A data compression apparatus for compressing a data buffer, the data buffer containing a plurality of symbols, each symbol occurring one or more times, comprising:

means for parsing the data buffer into occurrences of symbols;

means for generating a symbol table having an entry for each parsed symbol, each entry having a symbol and a unique indexing identifier;

means for retrieving each occurrence of each symbol from the data buffer;

means for determining the unique indexing identifier of the retrieved symbol;

means for encoding the determined unique indexing identifier into a variable-length portion, a delimiter, and a fixed-length portion such that the length of the variable-length portion is based on the number of occurrences of the retrieved symbol in the data buffer; and means for outputting the encoding.

13. The compression apparatus of claim 12 including means for determining the length of the fixed-length portion such that the total length of the encodings output is minimized.

14. The compression apparatus of claim 12 wherein the means for encoding the determined unique indexing identifier generates a variable-length portion that is a string with a length equal to the integer portion of the determined unique indexing identifier divided by 2 to the power of the length of the fixed-length portion and the fixed-length portion is the binary integer representation of the remainder of the determined unique indexing identifier divided by 2 to the power of the length of the fixed-length portion.

15. A decompression apparatus for decoding an encoded symbol, the encoded symbol represented an encoded index into a symbol table, the symbol table having a plurality of symbols, each symbol having a corresponding index into the symbol table, the decompression apparatus comprising:

means for decoding the encoded index to generate a decoded index; and means for retrieving the symbol corresponding to the decoded index from the symbol table wherein the retrieved symbol represents the decoded symbol.

16. The decompression apparatus of claim 15 wherein the encoded index has a variable-length portion, a delimiter, and a fixed-length portion.

17. The decompression apparatus of claim 16 wherein the means for decoding the encoded index determines the length of the variable-length portion and the length of the fixed-length portion and decodes the index by the formula $$Lv*2^{Lf}+f$$

wherein Lv is the length of the variable-length portion, Lf is the length of the fixed-length portion, and f is the value of an integer represented by the fixed-length portion.

* * * * *